United States Patent [19]

Lin

[11] Patent Number: 4,676,847

[45] Date of Patent: Jun. 30, 1987

[54] CONTROLLED BORON DOPING OF SILICON

[75] Inventor: Albert M. Lin, Allentown, Pa.

[73] Assignee: American Telephone and Telegraph Company AT&T Bell Laboratories, Murray Hill, N.J.

[21] Appl. No.: 857,077

[22] Filed: Apr. 29, 1986

Related U.S. Application Data

[62] Division of Ser. No. 694,806, Jan. 25, 1985, Pat. No. 4,604,150.

[51] Int. Cl.$^4$ .......................................... H01L 21/385
[52] U.S. Cl. ...................................... 148/188; 148/187
[58] Field of Search ................................. 148/188, 186

[56] References Cited

U.S. PATENT DOCUMENTS

| | | | |
|---|---|---|---|
| 3,066,052 | 11/1962 | Howard | 148/1.5 |
| 3,928,095 | 12/1975 | Harigaya et al. | 148/188 |
| 4,332,076 | 6/1982 | de Zaldivar | 29/571 |
| 4,353,086 | 10/1982 | Jaccodine et al. | 357/51 |
| 4,471,524 | 9/1984 | Kinsbron et al. | 29/571 |
| 4,472,212 | 9/1984 | Kinsbron | 148/188 |
| 4,502,202 | 3/1985 | Malhi | 29/571 |
| 4,502,894 | 3/1985 | Seto et al. | 148/1.5 |
| 4,507,849 | 4/1985 | Shinozaki | 29/576 W |
| 4,534,824 | 8/1985 | Chen | 29/576 W |
| 4,545,114 | 10/1985 | Ito et al. | 148/187 X |
| 4,549,914 | 10/1985 | Oh | 148/187 |
| 4,569,701 | 2/1986 | Oh | 148/188 |
| 4,581,319 | 4/1986 | Wieder et al. | 148/188 X |

FOREIGN PATENT DOCUMENTS 50-1986 1/1975 Japan .

OTHER PUBLICATIONS

Grove et al., *Journal of Applied Physics*, vol. 35, No. 9, Sep. 1964, pp. 2695-2701.
"The Oxidation Rate Dependence of Oxidation-Enhanced Diffusion of Boron and Phosphorus in Silicon", J. Electrochem. Soc.: *Solid-State Science and Technology*, Lin et al., May 1981, pp. 1131-1137.
"A High Performance, High Density 256K DRAM Utilizing 1X Projection Lithography", International Electron Devices Meeting, E. Adler et al., Dec. 5-7, 1983, pp. 327-330.
"Diffusion of Boron from Implanted Sources under Oxidizing Conditions", J. Electrochem. Soc.: *Solid-State Science and Technology*, J. L. Prince et al., vol. 121, No. 5, May 1974, pp. 705-710.
"A Corrugated Capacitor Cell (CCC)", *IEEE Transactions on Electron Devices*, vol. ED-31, No. 6, Sunami et al., Jun. 1984, pp. 746-763.
"A New Bipolar Process-Borsenic", *IEEE Journal of Solid-State Circuits*, vol. SC-11, No. 4, Saraswat et al., Aug. 1976, pp. 495-500.
"Diffusivity Summary of B,Ga,P,As, and Sb in $SiO_2$", J. Electrochem. Soc.: *Solid-State Science and Technology*, M. Ghezzo and D. M. Brown, Jan. 1973, pp. 146-148.

*Primary Examiner*—George T. Ozaki
*Attorney, Agent, or Firm*—James H. Fox

[57] ABSTRACT

A technique is described for doping a silicon body with boron. The surface to be doped is typically a trench sidewall, to be used as a storage capacitor or for isolation. By providing a silicon dioxide diffusion control layer, and a polysilicon source layer that incorporates the boron, well-controlled boron doping over a wide concentration range can be obtained. Control of the doping transfer can be obtained by the choice of ambients, either dry or steam. Furthermore, removal of the silicon dioxide and polysilicon layers following the doping process is facilitated due to the etch selectivity possible between $SiO_2$ and Si. If desired, the layers may remain on the silicon body.

8 Claims, 12 Drawing Figures

CONTROLLED BORON DOPING OF SILICON

This is a division of application Ser. No. 694,806, filed Jan. 25, 1985, now U.S. Pat. No. 4,604,150.

BACKGROUND OF THE INVENTION

1. Field of the Invention

The present invention relates to a technique for doping silicon with boron.

2. Description of the Prior Art

A variety of techniques have been utilized to dope semiconductor material. These may rely on a gaseous or solid source of dopant contacting the surface of the material. For example, it is known to diffuse a dopant from a vapor source so as to form a glass surface on a semiconductor body. The glass is then etched away, leaving a diffused surface region of the dopant in the semiconductor. Then, a heating step drives the dopant deeper into the semiconductor body a desired amount; see U.S. Pat. No. 3,066,052 coassigned with the present invention.

More recently ion implantation has been utilized, wherein ions are implanted into a surface region of a semiconductor body. The ions may be subsequently diffused further into the semiconductor body by a heating step, also referred to as a "drive-in" step. It is also known to implant the dopant into a solid material (e.g., polysilicon) contacting the surface of the semiconductor body, and subsequently diffuse the dopants into the semiconductor by a heating step, which also oxidizes the polysilicon; see U.S. Pat. No. 4,472,212 coassigned with the present invention. As a physical effect, it is known that the diffusion rate of common dopants (B, P, As) increases in silicon in the presence of an oxidation ambient; see "The Oxidation Rate Dependence of Oxidation - Enhanced Diffusion of Boron and Phosphorus in Silicon", A. M. R. Lin et al, *Journal of the Electrochemical Society*, p. 1131 (1981).

Recently, interest in dopant surfaces that are substantially vertical to the major surface of a semiconductor substrate has increased. This is due to a variety of proposals for forming "trenches" for isolation purposes, and to form vertical storage capacitors for dynamic random access memories (DRAM's); see, for example, "A Corrugated Capacitor Cell", H. Sunami et al, *IEEE Transactions on Electron Devices*, Vol. ED-31, No. 6, pp. 746–753 (1984). However, problems have arisen when applying the traditional doping techniques to trench technology. Firstly, ion implantation per se is not feasible in most cases, since the directionality of an ion beam implies that the dopant will be implanted for the most part only in horizontal surfaces, as referenced to the semiconductor substrate major surface. This is because vertical surfaces will be substantially parallel to the ion beam direction, and hence will be shielded from the ion species by the overlying regions for the most part.

One method for doping trench sidewalls is to fill the trench with a glass that contains the desired dopant, and then to diffuse the dopant into the trench sidewall by a heating step. However, it is then frequently desirable to subsequently remove the glass dopant source, which in turn may create additional processing difficulties. The use of a gas dopant source has also been considered. However, in the case of the most common p-type dopant, boron, the solubility of the boron in silicon is so high that the doping is difficult to control. For example, a dopant concentration in the range of about $1 \times 10^{16}$ to $5 \times 10^{17}$ atoms/cm$^3$ is typically desired for the p-type layer in trench capacitor sidewalls. The exposure of the sidewall to a boron-containing gas usually results in a doping level at the sidewall surface of about $1 \times 10^{19}$ atoms/cm$^3$. Even if a subsequent drive-in step is used to redistribute the boron deeper into the semiconductor, the doping concentration typically remains too high. Furthermore, the initial surface concentration is difficult to control.

It is also known to incorporate a dopant (e.g., arsenic) into a polysilicon layer, and diffuse the dopant into a silicon body by oxidizing the polysilicon; see U.S. Pat. No. 4,472,212 coassigned herewith. This technique utilizes the segregation effect, wherein the arsenic tends to be rejected from the moving silicon dioxide/silicon interface toward the silicon body. However, as applied to boron doping, this technique has the disadvantage that boron increases the difficulty of subsequently removing the oxidized polysilicon layer from the silicon body after the diffusion step. Hence, it is desirable to have an improved method for obtaining a boron-doped layer in a silicon body, including those with vertical features.

SUMMARY OF THE INVENTION

I have invented a technique for doping with boron a silicon body, typically, a vertical surface in an integrated circuit. In this technique, a layer of silicon dioxide is formed at least on the silicon feature to be doped. Next, a layer of polysilicon is deposited on the silicon dioxide layer. The polysilicon is provided with the boron dopant therein, typically during, or after it is deposited. A subsequent heating step in an oxidizing ambient then causes the polysilicon to at least partially oxidize, and the boron to diffuse through the oxide layer into the silicon body. This heating step is optionally accomplished in an atmosphere that provides a source of water molecules, for example steam, to increase the diffusion rate of the boron through the oxide. An optional heating step in an inert ambient causes the boron to diffuse further into the silicon body, without transferring a substantial amount of additional boron from the polysilicon layer. The at least partially oxidized polysilicon layer and the silicon dioxide layer may be removed if desired, or retained.

BRIEF DESCRIPTION OF THE DRAWINGS

FIGS. 5 and 6 show transferring the boron into the silicon, followed by drive-in.

DETAILED DESCRIPTION

Figure 1:
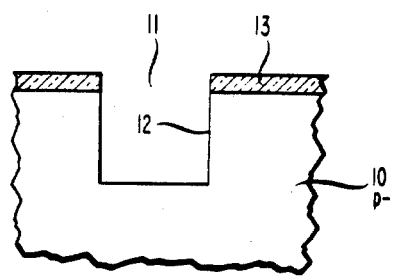
FIGS. 1–3 show in cross section a silicon semiconductor body having a trench, forming an SiO$_2$ layer, and depositing a polysilicon layer.

The following detailed description relates to a technique for doping a silicon semiconductor body with boron. Referring to FIG. 1, a silicon semiconductor body 10 is shown. The body is typically a monocrystalline silicon substrate or epitaxial layer formed thereon.

It may alternately be a polycrystalline or amorphous silicon body. In the exemplary embodiment, the silicon body 10 is lightly doped p-type material, suitable for forming n-channel field effect transistors therein. A trench 11 is formed in body 10, as by known etching techniques. One technique for forming the trench starts by forming a layer of silicon nitride on the silicon body, and then depositing a layer of $SiO_2$. The trench opening is then lithographically defined, and the $SiO_2$ and $Si_3N_4$ layers serve as an etch mask for forming the trench (11). The $SiO_2$ layer (not shown) is then removed, leaving a layer of $SiN_4$ (13) on the silicon body (10). This layer is typically about 1000 Angstroms thick for trench-forming purposes. This is sufficient to block the subsequent transfer of the boron into the silicon surfaces overlaid by layer 13. Other trench forming processes may substitute a $SiO_2$ or other layer for the $Si_3N_4$, or even omit such a layer. While the trench is shown rectangular for illustrative purposes, the etching process may result in a rounded or V-shaped bottom surface, rather than a flat surface, as shown. Furthermore, the sides of the trench may depart from the vertical to some degree. As used herein, sidewalls that are within plus or minus 20 degrees from being vertical to the major surface of the substrate are considered to be substantially vertical.

Figure 2:
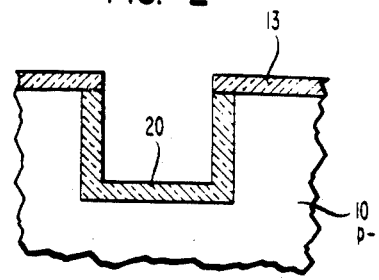

Referring to FIG. 2, a layer of silicon dioxide (20) is initially formed on the trench surface, including the bottom and sidewalls. The $SiO_2$ layer may also extend along the surface of the silicon body laterally from the trench, if desired, by prior removal of layer 13. If it is desired to prevent the subsequent transfer of boron into the horizontal surfaces surrounding the trench, the silicon nitride layer (13) can be retained. The $SiO_2$ layer serves two significant purposes in the present invention: firstly, it allows good control of the diffusion of the boron from the subsequently deposited polysilicon layer. This is because the diffusion rate of the boron is substantially less in the oxide than in either the silicon body or the polysilicon source layer. Further control of the diffusion is obtained through the choice of the ambient atmosphere during the heating steps described below. That is, a steam ambient promotes diffusion of the boron through the silicon dioxide layer, whereas a dry ambient substantially reduces diffusion of the boron through the silicon dioxide layer. For example, a difference in diffusion rates of over 10 may be obtained between a steam ambient as compared to a dry ambient. The "dry ambient" may be dry oxygen or an inert gas. The latter also prevents further oxidation of the polysilicon layer 30, and prevents the possibility of oxidizing the underlying silicon body 10. An inert ambient even further reduces the diffusion rate of boron through the silicon dioxide layer as compared to a dry oxygen ambient. This degree of diffusion control is very advantageous for purposes noted below.

The second purpose of the silicon dioxide layer (20) is to provide for etch selectivity when and if it is desired to remove the overlying polysilicon layer (30), since good etch selectivity is possible between polysilicon and silicon dioxide by known etching techniques. That is, the silicon dioxide can serve as an "etch stop". Furthermore, if it is desired to remove the silicon dioxide layer itself, that can also be accomplished by known etching techniques, with the silicon body then serving as the etch stop. For example, buffered HF, typically a mixture of ammonium fluoride and hydrofluoric acid, provides a very large etch selectivity when etching $SiO_2$ in the presence of Si.

The $SiO_2$ layer 20 can be formed by heating the silicon body in an oxidizing ambient, such as $O_2$ or steam, by procedures known in the art. A typical oxide thickness of 250 Angstroms may be obtained by heating in a dry $O_2$ ambient at 950° C. for about 30 minutes. The use of plasma-assisted oxidation is also known, and allows for lower heating temperatures. The $SiO_2$ layer may alternately be formed by deposition, as by the chemical vapor deposition of tetraethylorthosilicate (TEOS), or by other techniques known in the art. A typical thickness of the silicon dioxide layer is in the range of from 100 to 500 Angstroms (10 to 50 nanometers).

Figure 3:
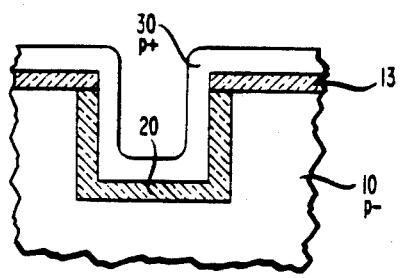

Referring to FIG. 3, the polysilicon layer 30 is deposited on the $SiO_2$ layer 20. The polysilicon layer serves as the source of the boron dopant, and hence is also referred to as the "source layer" herein. The polysilicon layer may be deposited by chemical vapor deposition (CVD) techniques known in the art. These techniques typically result in a conformal deposition of the polysilicon over the trench surfaces. A polysilicon thickness in the range of 2000 to 4000 Angstroms is usually suitable. Boron dopant may be incorporated in the source layer 30 by in situ doping as the polysilicon is being deposited. This may be accomplished, for example, by including $BBr_3$ in a chemical vapor deposition atmosphere that is used to dissociate silane ($SiH_4$) for obtaining the Si that is deposited. Alternately, the polysilicon layer may be exposed to a gas comprising boron after the deposition of layer 30 onto layer 20. This can form a boron glass on the surface of the polysilicon by a known chemical predeposition technique.

Figure 4:
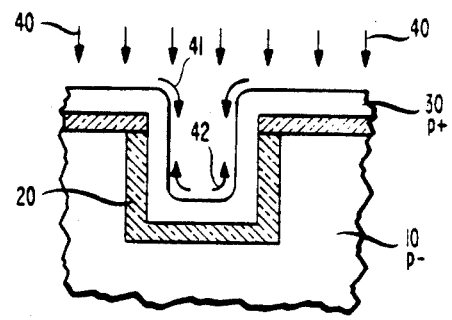
FIG. 4 shows a preferred method of incorporating boron into the polysilicon layer by ion implantation, followed by redistribution.

A present preferred method of incorporating boron in the source layer is illustrated in FIG. 4, wherein an ion beam 40 implants a boron species, typically B or $BF_2$ ions from a $BF_3$ source into the polysilicon layer 30. The species and implant energy are typically selected so that the boron is implanted into the polysilicon without extending into oxide layer 20. An implant energy of about 30 KeV is typical. The boron will be implanted primarily into the horizontal surfaces as viewed, with relatively little being initially located in the vertical sidewalls, if the ion beam is directed vertically to the substrate surface, as shown. (The substrate may be tilted somewhat to include additional boron into the sidewalls.)

Following the implant, the semiconductor body is heated to an elevated temperature, typically around 950° C. for a period of 4 hours for a trench 4 micrometers deep or less. This serves to redistribute the boron more evenly throughout the polysilicon layer by rapid solid state diffusion, as indicated by the arrows 41, 42. The boron diffuses from the horizontal surfaces at both the top and bottom of the trench into the vertical sidewalls. The heating step that produces the redistribution is desirably accomplished in a dry ambient; that is, in an atmosphere that does not include a substantial amount of water molecules. This prevents a substantial amount of boron from migrating through the oxide if the temperature during redistribution is not excessive, being typically less than 1000° C. The ambient is also desirably inert for this step; a nitrogen or argon ambient is satisfactory. An inert ambient allows the redistribution to proceed in the polysilicon layer without oxidizing or otherwise reacting the polysilicon layer 30.

Figure 5:
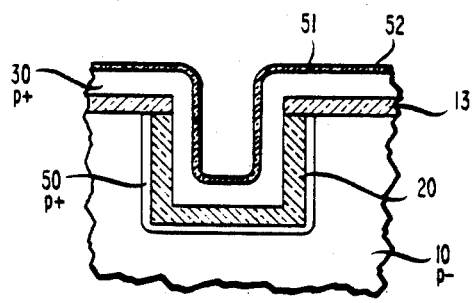

After incorporating the boron into the source layer 30 by whatever method, the silicon body is exposed to an atmosphere comprising steam at an elevated temperature, in order to transfer the boron from the source layer 30 into the silicon body 10. One prior art technique for producing steam uses a carrier gas, typically nitrogen, to carry water vapor into a furnace. Another known technique pyrogenically combines oxygen and hydrogen to form $H_2O$ in situ. Typically, the atmosphere comprises at least a 10 percent partial pressure of steam at a total pressure of one atmosphere (760 mm of Hg) or more. Two processes occur during the transfer step: the steam provides oxygen that oxidizes the polysilicon layer 30, beginning at the exposed surface. This produces a "top" oxide layer 52 in the exposed portion of polysilicon layer 30; see FIG. 5. A $SiO_2/Si$ interface 51 thus moves inward from the exposed surface of layer 30 toward the silicon body 10, and hence toward $SiO_2$ layer 20. However, boron tends to segregate towards the oxide side of this interface. This tends to reduce the boron concentration in the remaining polysilicon as the "top" oxide grows. This oxidizing of source layer 30 may proceed until it is entirely converted to $SiO_2$, or may be halted part-way through the process.

The second process that occurs in the steam ambient is the diffusion of the boron from the source layer 30 through the $SiO_2$ layer 20 and into the silicon body 10. This is significantly facilitated by the presence of water molecules in the ambient, which increases the rate of boron diffusion through $SiO_2$. I have determined that this second process allows sufficient boron to be transferred through oxide layer 20, even though the boron tends to be rejected toward the top oxide layer as it grows on the polysilicon. The result of this heating step, also referred to as the "transfer" step herein, is a relatively thin layer 50 of boron in the bottom and the vertical sidewalls of the trench; see FIG. 5. The inventive technique will be more fully illustrated by means of the following Examples.

EXAMPLE I

With a 350 Angstrom thick grown oxide layer (20) grown in a dry $O_2$ ambient at 950 degrees C., a polysilicon layer (30) 4000 Angstroms thick was implanted with $1 \times 10^{16}$ atoms/cm$^2$ of boron. The silicon body was then heated in a steam atmosphere at 950° C. for 30 minutes. About 2000 Angstroms of the polysilicon was oxidized. A portion of the boron was thereby transferred from the polysilicon layer into the silicon body (10), resulting in a boron doped layer (50) having a surface concentration of about $6 \times 10^{17}$ atoms/cm$^3$. If a subsequent drive-in step is used, the concentration is reduced according to the depth of the drive-in.

The transfer step may alternately be accomplished in a dry atmosphere if reduced diffusion rates of boron through the silicon dioxide are desired.

EXAMPLE II

With a 150 Angstrom thick grown oxide layer (20) grown in a dry $O_2$ ambient at 950 degrees C., a polysilicon layer (30) 4000 Angstroms thick was implanted with $1 \times 10^{16}$ atoms/cm$^2$ of boron. It was heated at 950° C. for 1 hour in a dry oxygen ambient. This resulted in a transfer of boron into the underlying silicon body (10) to produce a surface doping level of $9.1 \times 10^{16}$ boron atoms/cm$^3$.

Hence, as shown in Example II, the use of a relatively thinner $SiO_2$ layer and a relatively longer heating time in dry oxygen as compared to the previous steam oxidation case (Example I) also resulted in a useful amount of boron transfer. I estimate that for otherwise equal conditions (oxide thickness, heating time and temperature, etc.) the use of a steam ambient at 1 atmosphere pressure results in typically about 50 to 100 times more boron transfer than for a dry oxygen ambient.

Figure 6:
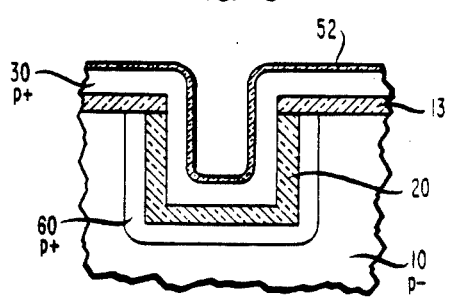

The transfer step is optionally followed by a dopant drive-in step that increases the depth of the boron doped region in silicon body 10; this expanded region is shown as 60 in FIG. 6. The concentration of boron in the expanded region is accordingly reduced. The drive-in step is accomplished in a dry atmosphere, to reduce or prevent further transfer of boron from the source layer. The atmosphere for drive-in is also desirably inert, to prevent further oxidation of the silicon body 10. It is apparent that $SiO_2$ layer 20 thus again provides for improved control of the doping process, due to the controllable nature of boron transfer therethrough as a function of ambient atmosphere. The degree of boron diffusion can be estimated for a given time and temperature for the drive-in step, according to diffusion models known in the art. In addition to the choice of the ambient during heating, the oxide and polysilicon layer thicknesses, and implant dose, provide additional degrees of control. By appropriate choice of transfer and drive-in conditions, a wide range of boron concentrations, typically at least from $1 \times 10^{16}$ to $1 \times 10^{20}$ atoms/cm$^3$, can be achieved. This includes the range of $1 \times 10^{16}$ to $5 \times 10^{17}$ atoms/cm$^3$ most suitable for trench sidewall doping, and also a higher range for forming source and drain regions, etc. In areas where the $Si_3N_4$ layer 13 has been retained (e.g., at the top of the trench), the transfer of the boron into the silicon body 10 is blocked. When it is desired to isolate two adjacent trench capacitors, the drive-in typically proceeds sufficiently to prevent overlap of the depletion regions of the adjacent trenches during operation.

Figure 7:
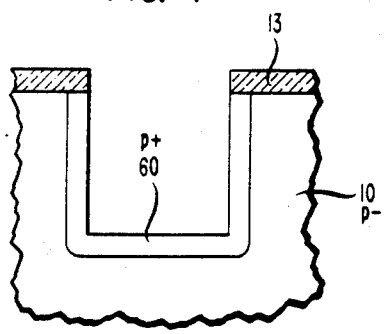
FIGS. 7–10 show additional steps suitable for forming a trench capacitor.
Figure 8:
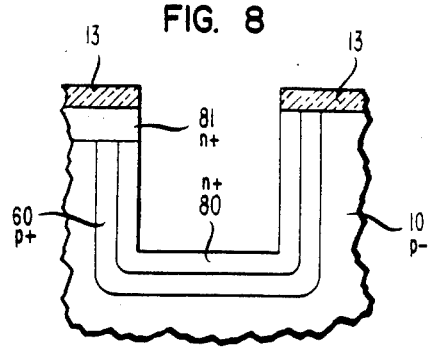

A variety of process steps may follow the boron doping steps. For example, to form a capacitor, the top oxide portion (52) of the polysilicon source layer 30 and $SiO_2$ layer 20 may be removed by etching in buffered HF; see FIG. 7. If an unoxidized portion of the polysilicon source layer is present, it may be removed, following removal of the top oxide, with KOH chemical etching, or by dry etching techniques known in the art. Following the removal of layers 30 and 20, an n+ doped region 80 may be formed, in order to serve as a plate of the capacitor and contact the source region of an n-channel access transistor (not shown), and to form a "high-C" capacitor cell; see FIG. 8. For this purpose, another n+ region (81) may be formed prior to the formation of the trench, in order to connect region 80 to the source/drain region of the n-channel access transistor. The n+ regions (80, 81) may be produced by prior art techniques, such as that noted in U.S. Pat. No. 4,472,212, cited above.

Figure 9:
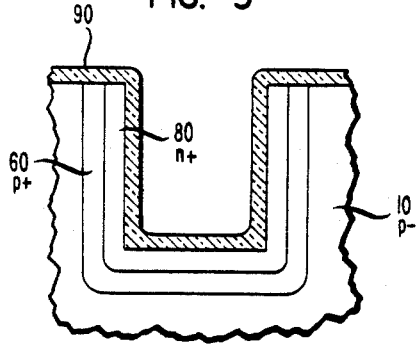
Figure 10:
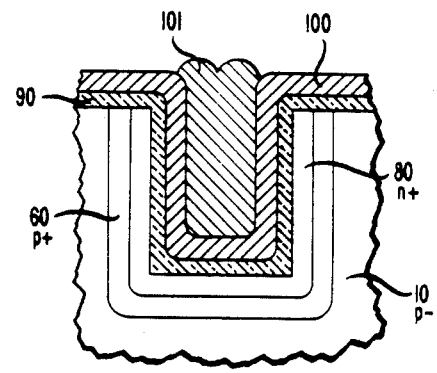

If it is desired to make a non high-C capacitor, the n+ layers (80, 81) can be omitted. The capacitor is then electrically accessed by an inversion layer extending from the source of the access transistor around the trench, in lieu of the n+ layer. In either case, the layer 13 may optionally be removed. A dielectric for the capacitor may be formed by oxidizing the exposed silicon, including the doped sidewalls of the trench, to form $SiO_2$ layer 90; see FIG. 9. If desired, a silicon nitride layer can be deposited thereon to form a dual dielectric (not shown). Other steps can form a conductive region to serve as the inner plate of the capacitor, such as a doped polysilicon layer 100, shown in FIG. 10. The deposition of an oxide insulating layer (not shown)

followed by an additional, relatively thick polysilicon layer, followed by anisotropic reactive ion etching, can be used to form a planarizing region 101 that fills the remaining space in the trench.

Figure 11:
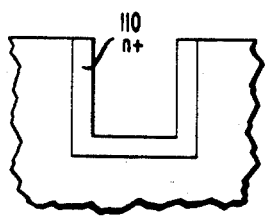
FIG. 11 shows forming the n+ layer prior to doping with boron to form the p+ layer.

The sequence of the doping steps to form a capacitor may be varied. As shown in FIG. 11, an n+ layer 110 may be initially formed in the silicon trench before applying the present technique. Then, the process steps noted above for FIGS. 2-6 may be used to obtain the boron (p+) doped region (not shown). Since the diffusion coefficient for boron in silicon is greater than that for n-dopant arsenic, the drive-in step can provide for the p+ region extending further into the silicon body 10 than the n+ region. Also, the n+ doping level is typically greater than the p+ level, allowing a net n+ dopant type nearer the surface of the sidewall. This can result in the doped structure shown in FIG. 8, along with the presence of the SiO₂ layer (20) and the source layer (30) as shown in FIG. 3. Then, these latter two layers may remain on the silicon body, if desired. For example, the layer 20 may serve as the dielectric of the capacitor. Also, the remaining unoxidized portion of polysilicon source layer 30 may be used as a plate of the capacitor. This may be facilitated by the removal of the top oxide layer (52). It is also apparent that if the capacitor is to be accessed by a p-channel transistor, then the present technique can be used to form the p+ region nearer the surface of the trench sidewall than the n+ region, as by the appropriate choice of drive-in conditions, or by elimination of the drive-in step.

Figure 12:
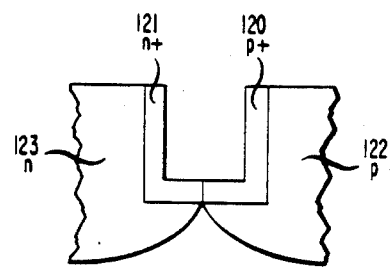
FIG. 12 shows an isolation trench between n and p regions.

As noted above, the present technique can also be used to dope the sidewall of an isolation trench between active devices. For example, an isolation trench for complementary metal oxide silicon (CMOS) integrated circuits may utilize heavily doped n+ and p+ sidewalls to prevent inversion due to stray electric fields between n and p tub regions. Referring to FIG. 12, the present technique can be used to form the p+ region (120) on the sidewall contacting the p-tub (122). Furthermore, the walls of isolation trenches between devices within the same p-tub may be doped by the present technique. In that case, both sidewalls of the trench may be p+ doped.

The foregoing has stressed the advantages of the present technique for doping relatively inaccessible vertical sidewalls, where the conformal nature of the polysilicon deposition and controllability of dopant transfer are very advantageous. However, the present technique may also be used to dope horizontal silicon surfaces, such as for sources and drains of p-channel field effect transistors. The controllability of boron transfer is also advantageous there. Also, the present technique avoids direct ion implantation of the silicon body. Hence, there is substantially no ion damage to the silicon body by the present technique. Furthermore, the junction depths may be shallower than if direct ion implantation of the dopant into the silicon body is used. Also, the boron doping concentration produced by the present technique is highest nearest the surface of the silicon body, and decreases with depth therein. This is frequently desirable to produce "lightly doped drain" structures or for other purposes, as it allows good electrical contact at the surface. (In contrast, direct ion implantation typically results in a maximum dopant concentration at some point below the surface.) Finally, the activation of the boron dopant may be accomplished during the transfer step of the present technique, avoiding a separate step.

What is claimed is:

1. A method of making an integrated circuit by steps comprising doping at least a portion of a silicon body with boron
   characterized by steps comprising:
   forming a layer of silicon dioxide on a surface of said silicon body;
   forming a layer of silicon comprising boron on at least a portion of said layer of silicon dioxide;
   heating said layer of silicon in an atmosphere comprising water molecules to oxidize at least a portion of said layer of silicon and substantially promote the transfer of a portion of the boron from said layer of silicon through said layer of silicon dioxide and into said silicon body.

2. The method of claim 1 further comprising the step of removing an oxidized portion of said layer of silicon.

3. The method of claim 1 wherein a portion of said layer of silicon remains unoxidized following said heating.

4. The method of claim 3 further comprising the step of removing an unoxidized portion of said layer of silicon.

5. The method of claim 1 further comprising the step of removing at least a portion of said layer of silicon dioxide from the surface of said silicon body.

6. The method of claim 1 wherein said forming a layer of silicon comprising boron is accomplished by steps comprising depositing boron while depositing silicon.

7. The method of claim 1 wherein said forming a layer of silicon comprising boron is accomplished by steps comprising depositing silicon and thereafter implanting at least a portion of the deposited silicon with boron.

8. The method of claim 1 wherein said implanting is accomplished in a first portion of said deposited silicon, and thereafter heating said deposited silicon to redistribute boron into a second portion of said deposited silicon.

* * * * *